United States Patent
Kim et al.

(10) Patent No.: US 11,515,853 B2
(45) Date of Patent: Nov. 29, 2022

(54) EQUALIZER FOR EQUALIZATION OF MUSIC SIGNALS AND METHODS FOR THE SAME

(71) Applicant: SAMSUNG ELECTRONICS CO., LTD., Suwon-si (KR)

(72) Inventors: Kibeom Kim, Suwon-si (KR); Hoon Heo, Gunpo-si (KR); Sangmo Son, Suwon-si (KR); Sunmin Kim, Suwon-si (KR); Jaeyoun Cho, Suwon-si (KR); Shukjae Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/088,780

(22) Filed: Nov. 4, 2020

(65) Prior Publication Data
US 2021/0203298 A1    Jul. 1, 2021

(30) Foreign Application Priority Data

Dec. 31, 2019    (KR) .................. 10-2019-0179784

(51) Int. Cl.
*H03G 5/16*    (2006.01)
*H04R 1/22*    (2006.01)

(52) U.S. Cl.
CPC .......... *H03G 5/165* (2013.01); *H04R 1/22* (2013.01)

(58) Field of Classification Search
CPC .................. H03G 5/165; H04R 1/22
See application file for complete search history.

(56) References Cited

U.S. PATENT DOCUMENTS

| 9,380,385 | B1 | 6/2016 | Skinner et al. |
| 9,621,124 | B2 | 4/2017 | Lu et al. |
| 9,680,437 | B2 | 6/2017 | Clark |
| 10,057,674 | B1 | 8/2018 | Tseng et al. |

(Continued)

FOREIGN PATENT DOCUMENTS

| CN | 109087634 A | 12/2018 |
| EP | 3142111 A1 | 3/2017 |

(Continued)

OTHER PUBLICATIONS

Sanjit K. Mitra, "Digital Signal Processing A Computer-Based Approach", 2001, McGraw-Hill, Second Edition, pp. 671-674 (Year: 2001).*

(Continued)

*Primary Examiner* — Daniel R Sellers
(74) *Attorney, Agent, or Firm* — Sughrue Mion, PLLC

(57) ABSTRACT

An equalizer and a method of controlling same are provided. The equalizer includes a memory storing an EQ value set for a plurality of music attributes and storing a general-purpose EQ value; and a processor configured to: obtain an input music signal; calculate a plurality of probability values for the plurality of music attributes by analyzing attributes of the input music signal based on a convolutional neural network; calculate a moderate index between the plurality of probability values; generate an EQ value based on the plurality of probability values and the moderate index; and perform equalizing by applying the generated EQ value to the input music signal.

11 Claims, 9 Drawing Sheets

(56) References Cited

U.S. PATENT DOCUMENTS

| | | |
|---|---|---|
| 10,734,963 B2 | 8/2020 | Shaya et al. |
| 11,039,243 B2 | 6/2021 | Leschka et al. |
| 2009/0306797 A1* | 12/2009 | Cox ................. G06F 16/683 |
| | | 707/E17.103 |
| 2014/0369519 A1 | 12/2014 | Leschka et al. |
| 2016/0056787 A1* | 2/2016 | Lu ......................... G10H 1/46 |
| | | 381/101 |
| 2016/0373860 A1 | 12/2016 | Leschka et al. |
| 2017/0070817 A1 | 3/2017 | Seo et al. |
| 2017/0300289 A1 | 10/2017 | Gattis |
| 2018/0068670 A1 | 3/2018 | Lu et al. |
| 2018/0218746 A1 | 8/2018 | Baumgarte |
| 2018/0242072 A1 | 8/2018 | Jones |
| 2018/0262175 A1 | 9/2018 | Celestinos Arroyo |
| 2018/0276540 A1* | 9/2018 | Xing ................... G06N 3/0454 |
| 2018/0332392 A1 | 11/2018 | Rabinowitz et al. |
| 2019/0103848 A1 | 4/2019 | Shaya et al. |
| 2019/0103849 A1 | 4/2019 | Shaya et al. |
| 2019/0208344 A1 | 7/2019 | Schuster et al. |
| 2020/0036354 A1* | 1/2020 | Matsukawa .......... H04R 1/1091 |
| 2020/0160878 A1* | 5/2020 | Heo ..................... G06N 3/0454 |

FOREIGN PATENT DOCUMENTS

| | | |
|---|---|---|
| JP | 2015-513836 A | 5/2015 |
| JP | 2019-91971 A | 6/2019 |
| KR | 10-2015-0111184 A | 10/2015 |
| KR | 10-1672210 B1 | 11/2016 |
| KR | 10-2017-0030384 A | 3/2017 |
| KR | 10-1915120 B1 | 11/2018 |

OTHER PUBLICATIONS

West, K., and Cox, S., "Finding An Optimal Segmentation for Audio Genre Classification", Sep. 2005, ISMIR, 6th International Conference on Music Information Retrieval, pp. 680-685. (Year: 2005).*

International Search Report (PCT/ISA/210) issued by the International Searching Authority in International Application No. PCT/KR2020/019195, dated Apr. 19, 2021.

Written Opinion (PCT/ISA/237) issued by the International Searching Authority in International Application No. PCT/KR2020/019195, dated Apr. 19, 2021.

* cited by examiner

EQUALIZER FOR EQUALIZATION OF MUSIC SIGNALS AND METHODS FOR THE SAME

CROSS-REFERENCE TO RELATED APPLICATION

This application is based on and claims priority under 35 U.S.C. § 119 to Korean Patent Application No. 10-2019-0179784, filed on Dec. 31, 2019, in the Korean Intellectual Property Office, the disclosure of which is incorporated by reference herein in its entirety.

BACKGROUND

1. Field

The disclosure relates to an equalizer for equalization of music signals and a method for the same, and more particularly, to an equalizer for automatically equalizing music signals and a method for the same.

2. Description of Related Art

Most music reproducing devices provide acoustic effects as an equalizer (EQ). The equalizer is an audio signal processing technique of applying different gain for each frequency band of an audio signal and is generally defined to have different EQ set values depending on music genres. By applying the EQ acoustic effect, the user may complement insufficient speaker reproduction performance or reflect personal tone preference.

However, in a method of the related art in which the user selects the EQ effect by himself or herself, it is very inconvenient for the user to set the EQ effect each time when playing a music, and consumes extra effort and time for a normal user, who may have no clear criteria of tones, in determining or tuning the EQ effect.

SUMMARY

Embodiments of the disclosure provide an equalizer for improving sound quality and enhancing usability of a music reproduction system by grasping characteristics of a music signal, automatically generating a suitable EQ effect, and applying the EQ effect to the music signal.

According to an embodiment, there is provided an equalizer including: a memory storing an EQ value set for a plurality of music attributes and storing a general-purpose EQ value; and a processor configured to: obtain an input music signal; calculate a plurality of probability values for the plurality of music attributes by analyzing attributes of the input music signal based on a convolutional neural network; calculate a moderate index between the plurality of probability values; generate an EQ value based on the plurality of probability values and the moderate index; and perform equalizing by applying the generated EQ value to the input music signal.

The processor is further configured to, based on the input music signal being obtained, perform a preprocessing operation of reducing a data size of the input music signal.

The processor is further configured to convert the input music signal with the reduced data size into a two-dimensional time-frequency signal and provide the two-dimensional time-frequency signal to the convolutional neural network.

The processor is further configured to calculate the moderate index using an expression $$M = 1 - \frac{\sum_{i=1}^{n} \sum_{j=1}^{i} |p_i - p_j|}{n-1},$$

where M represents the moderate index, $p_i$ represents a probability value for a music attribute i among the plurality of music attributes, and n represents a total number of the plurality of music attributes.

The processor is further configured to generate the generated EQ value using expressions $G_{eq} = M \cdot G_{moderate} + (1-M) G_{attribute}$ and $G_{attribute} = \sum_{i=1}^{n} p_i \cdot G_i$, where $G_{eq}$ represents the generated EQ value, M represents the moderate index, $G_{moderate}$ represents the general-purpose EQ value, $G_i$ represents an EQ value i set for a music attribute i, $p_i$ represents a probability value for the music attribute i among the plurality of music attributes, and $G_{attribute}$ represents a gain value obtained based on the probability value for the music attribute i and the EQ value i set for the music attribute i.

One of the plurality of music attributes includes at least one from among a loud attribute, a soft attribute related to a tone, a dynamic attribute and a slow attribute related to complexity of a rhythm.

According to an embodiment, there is provided an equalizing method of an equalizer, the method includes: obtaining an input music signal; calculating a plurality of probability values for a plurality of music attributes by analyzing attributes of the input music signal based on a convolutional neural network; calculating a moderate index between the plurality of probability values; generating an EQ value based on the plurality of probability values and the moderate index; and performing equalizing by applying the generated EQ value to the input music signal.

The equalizing method further includes, based on the input music signal being obtained, reducing a data size of the input music signal.

The equalizing method further includes converting the input music signal with the reduced data size into a two-dimensional time-frequency signal.

The calculating the moderate index between the plurality of probability values includes: calculating the moderate index using an expression $$M = 1 - \frac{\sum_{i=1}^{n} \sum_{j=1}^{i} |p_i - p_j|}{n-1},$$

where M represents the moderate index, $p_i$ represents a probability value for a music attribute i among the plurality of music attributes, and n represents a total number of the plurality of music attributes.

The generating the generated EQ value based on the plurality of probability values and the moderate index includes: generating the generated EQ value using expressions $G_{eq} = M \cdot G_{moderate} + (1-M) G_{attribute}$ and $G_{attribute} = \sum_{i=1}^{n} p_i \cdot G_i$, where $G_{eq}$ represents the generated EQ value, M represents the moderate index, $G_{moderate}$ represents the general-purpose EQ value, $G_i$ represents an EQ value i set for a music attribute i, $p_i$ represents a probability value for the music attribute i among the plurality of music attributes, and $G_{attribute}$ represents a gain value obtained based on the probability value for the music attribute i and the EQ value i set for the music attribute i.

One of the plurality of music attributes includes at least one from among a loud attribute, a soft attribute related to a tone, a dynamic attribute and a slow attribute related to complexity of a rhythm.

According to an embodiment, there is provided a non-transitory computer readable recording medium storing a program for performing equalizing, the program when executed by a processor, causes the processor to: based on an input music signal being obtained, reduce a data size of the input music signal; convert the input music signal with the reduced data size into a two-dimensional time-frequency signal and provide the two-dimensional time-frequency signal as an input of a convolutional neural network; calculate a plurality of probability values for a plurality of music attributes by analyzing attributes of the input music signal based on the convolutional neural network; calculate a moderate index between the plurality of probability values; generate an EQ value based on the plurality of probability values and the moderate index; and perform equalizing by applying the generated EQ value to the input music signal.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

The embodiments described below are exemplified for understanding of the disclosure and it should be understood that the disclosure may be modified and performed variously from the embodiments described herein. However, in describing the disclosure, a detailed description and specific drawings of the related art or configuration may be omitted when it is determined that the detailed description may unnecessarily obscure a gist of the disclosure. In addition, the accompanying drawings may not be illustrated with actual scales but may be illustrated with enlarged dimensions of some elements, for the understanding of the disclosure.

The terms in the disclosure are used in general sense in consideration of functions in the embodiments of the disclosure. But, the meaning of these terms may vary in accordance with the intention of those skilled in the art, the legal or technical interpretation, the emergence of new technologies and the like. In addition, there are terms arbitrarily selected by the applicant. Such terms may be interpreted as defined in this disclosure and may be interpreted based on general context of the disclosure and common technical knowledge of the technical field.

It should be understood that the order of each step is not limited, unless a previous step should be performed before a subsequent step logically and in time. In other words, other than the above exceptions, the gist of the disclosure is not affected even if the process described as the subsequent step is performed before the process described as the previous step, and a scope of a right also should be defined regardless of the order of steps.

In the disclosure, the terms such as "comprise", "may comprise", "consist of", or "may consist of" are used to designate a presence of corresponding features (e.g., constituent elements such as number, function, operation, or part), and not to preclude a presence of additional features.

Elements described in the embodiments of the disclosure may be changed or omitted and other elements may be added. In addition, the elements may be divided and disposed in different independent devices.

Hereinafter, the embodiments of the disclosure will be described in more detail with reference to the accompanying drawings.

Figure 1:
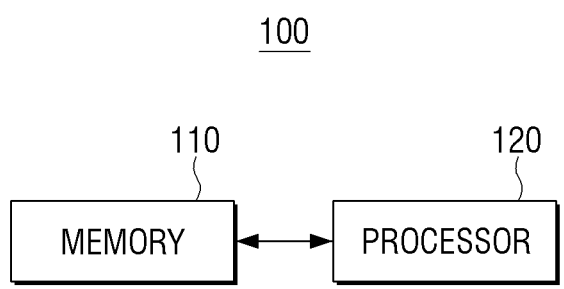
FIG. 1 is a block diagram illustrating an equalizer according to an embodiment.

FIG. 1 is a block diagram for illustrating an equalizer according to an embodiment.

An equalizer 100 according to an embodiment may be applied to various devices such as a speaker, a microphone, a TV, a mobile phone, a laptop, a tablet PC, a desktop PC, and the like.

Referring to FIG. 1, the equalizer 100 may include a memory 110 and a processor 120.

The memory 110 may store an operating system (OS) for controlling general operations of elements of the equalizer 100 and instructions or data related to the elements of the equalizer 100.

Particularly, the memory 110 may be implemented as a non-volatile memory, a volatile memory, a flash memory, a hard disk drive (HDD), a solid state drive (SSD), or the like. The memory 110 may be accessed by the processor 120 and reading, recording, editing, deleting, or updating of the data by the processor 120 may be executed. The memory 110 may be a read-only memory (ROM) and random access memory (RAM) in the processor 120, or a memory card (e.g., micro SD card or memory stick) mounted on the equalizer 100.

In addition, the memory 110 may store a program and data for configuring various screens to be provided in a display area of a display 140. Specific description regarding various screens to be provided in the display area of the display 140 will be described below with reference to FIG. 9.

Particularly, the memory 110 may store information regarding a predetermined EQ value and a general-purpose EQ value for each of a plurality of music attributes. The specific description regarding the information of the predetermined EQ value for each of the plurality of music attributes will be described below with reference to FIG. 3 and the specific description regarding the information of the general-purpose EQ value will be described below with reference to FIG. 4. The music attribute is used as a classification criterion of music and, for example, music attributes may be classified according to signal patterns mainly generated in a music signal.

An EQ value may refer to a value of a gain generated by equalizing of the equalizer 100. The EQ value may refer to an EQ gain set value, an EQ set value, an EQ curve, and the like.

The processor 120 may control general operations of the equalizer 100. For this, the processor 120 may include one or more of a central processing unit (CPU), an application processor (AP), or a communication processor (CP).

The processor 120 may operate an operating system or an application program to control hardware or software elements connected to the processor 120 and perform various data processing and operations. In addition, the processor 120 may load and process an instruction or data received from at least one of other elements on a volatile memory and store various pieces of data in a non-volatile memory.

The processor 120 may receive a music signal and analyze an attribute of the input music signal based on a convolutional neural network 122-1. The specific description regarding the convolutional neural network 122-1 will be described below with reference to FIG. 2.

The processor 120 may calculate a probability value for each of the plurality of music attributes of the input music signal and calculate a moderate index M between each probability value. The probability value for each attribute may be a value numerically representing what degree of weight each attribute occupies with respect to the entire input music signal. The probability value for each music attribute may be defined as a real number ranging from 0 to 1, so that a sum of the probability values for each music attribute is 1.

The moderate index M may be an index for determining whether one distinct music attribute appears or the plurality of music attributes similarly appear. The specific description regarding moderate index calculation 122-2 will be described below with reference to FIG. 2.

The processor 120 may generate an EQ value based on the probability value for each of the plurality of music attributes of the input music signal and the moderate index and apply the EQ value to the input music signal for equalizing. The specific description regarding EQ value determination 123-1 and EQ application 123-2 will be described below with reference to FIG. 2.

Figure 2:
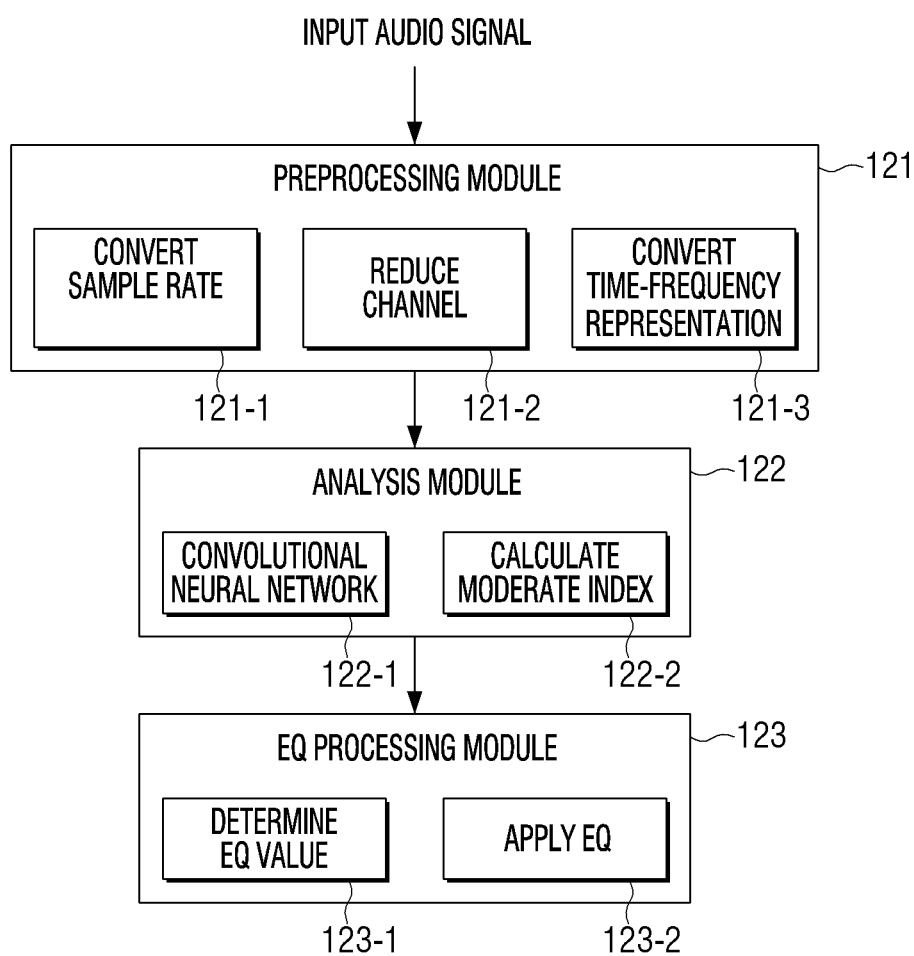
FIG. 2 is a block diagram illustrating a processor according to an embodiment.

FIG. 2 is a block diagram illustrating the processor according to an embodiment.

Referring to FIG. 2, the processor 120 according to an embodiment may include a preprocessing module 121, an analysis module 122, and an EQ processing module 123.

When an audio signal is input, the preprocessing module 121 may reduce a data size of the input signal. The audio signal may include, for example, a music signal.

The preprocessing module 121 may receive a music signal and reduce a sample rate of the music signal (121-1). For example, the sample rate of the general music signal is 44.1 kHz or 48 kHz, but the preprocessing module 121 may downsample the sample rate to a lower sample rate having information sufficient to analyze characteristics of music. For example, the sample rate may be reduced down to 12 kHz to 16 kHz and still have information sufficient to analyze the characteristics of a music signal.

In addition, the preprocessing module 121 may convert (downmix channel) the input audio signal into a mono channel signal (121-2). For example, if the input audio signal is a stereo channel signal, a left channel and a right channel may be used or only one of the left channel and the right channel may be used.

As described above, the preprocessing module 121 may reduce the data size to an appropriate level to enable faster and efficient operation of the analysis module 122.

In addition, the preprocessing module 121 may convert an one-dimensional audio signal into a two-dimensional time-frequency representation form suitable for input of the convolutional neural network (121-3). The one-dimensional audio signal may refer to an audio signal in a time-amplitude data form.

For example, the input audio signal may be converted (121-3) into a two-dimensional time-frequency representation form by using a process of calculating a power spectrum via a fast Fourier transform (FFT).

Further, the input audio signal may be converted (121-3) into a two-dimensional time-frequency representation form by using a process of reducing a frequency dimension of a spectrum to a lower dimension via Mel-scale filter bank.

The process of reducing the data size of the music signal input may include converting into a time-frequency representation form suitable to input the music signal to the convolutional neural network.

The analysis module 122 may analyze music attributes of the input audio signal by calculating the probability value for each music attribute and determine a corresponding music attribute to the input audio signal.

In this case, the analysis module 122 may immediately calculate the music attribute of the input audio signal. The input method of the audio signal may include receiving audio file data via an external server or via a microphone 150 (shown in FIG. 9).

The classification criterion of the music attribute may be variously defined and may be defined at basic level so that all of various music are expressed as much as possible. The music genre is advantageous since it is intuitively related to EQ set values predefined by a music player or an editor, however, it may be disadvantageous in a sense that there are diverse subgenres in a case of popular genres such as pop or rock, and these may not be specified with one representative EQ value. In addition, the same music may be recognized as different genres depending on people due to ambiguity of the genre criteria.

Accordingly, instead of using the music genre as the classification criterion, according to an embodiment, four low-dimensional music attributes such as loud, soft, dynamic, and slow mainly appearing in the music in accordance with a signal pattern and EQ set values suitable thereto may be used.

In the above example, the music genres are divided into four attributes, but in the implementation, only two or three attributes may be used or five or more attributes may be used. For the sake of comprehensive description, these four attributes will be used to describe the embodiments of the disclosure. However, the embodiments are not limited thereto.

Figure 3:
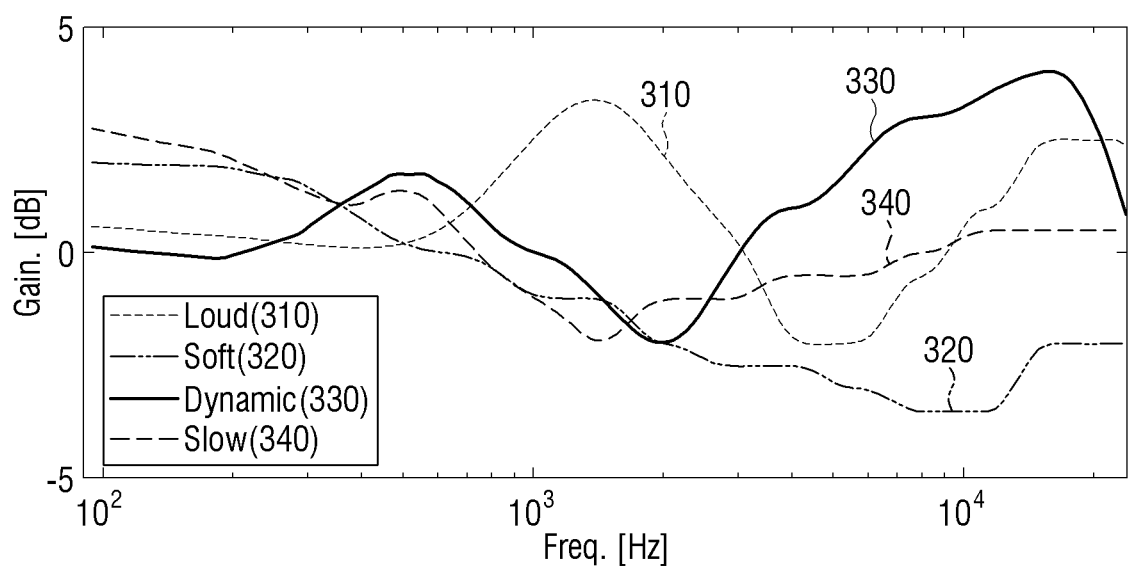
FIG. 3 is a diagram illustrating EQ gain set values for each attribute of a music signal according to an embodiment.

The four music attributes will be described with reference to FIG. 3. FIG. 3 is a diagram illustrating EQ gain set values for each attribute of a music signal according to an embodiment.

The loud attribute and the soft attribute may relate to a tone. For example, the loud attribute and the soft attribute may relate to a harsh degree of the tone. The tone may be characteristics of a sound which may be distinct even with the same size and height of the sound. The user may distinguish a harsh tone and a gentle tone in accordance with a waveform of the sound.

A loud attribute 310 may be an attribute of a noisy tone. The loud attribute 310 may relate to terms such as noisy, a lot of instruments, an electronic sound, metal, and the like, and high and uniform energy distribution may appear mainly in full-band spectrum. An EQ value for reinforcing a noisy tone in a high range rather than a low range may be generated for the loud attribute 310 by considering that sound sources with a large amount of full-band components are mainly classified.

The soft attribute 320 may be an attribute of gentle and natural tone. The soft attribute 320 may relate to terms such as a natural sound, single instrument, fluid playing, folk, and the like, and distinct harmonic structure and suitable energy may appear mainly. Accordingly, an EQ value for emphasizing softness of a tone by emphasizing a middle and low band by approximately 30% compared to a high band increased amount may be generated for the soft attribute 320.

The dynamic attribute and the slow attribute may relate to complexity of a rhythm. For example, the dynamic attribute and the slow attribute may relate to a dynamic degree and a tempo of the rhythm. The rhythm is a regular flow repeating beats or dynamics of sounds.

A dynamic attribute 330 may be an attribute regarding dynamic and fast rhythm. The dynamic attribute 330 may relate to terms such as EDM, Hip-hop, bouncing, spiking, and the like, and mainly a short and strong acoustic event may appear frequently in a moment. Rhythmical music with strong beats may be classified for the dynamic attribute 330 and an EQ value for emphasizing a low tone and a middle and high band tone excluding an ultralow tone may be generated for the sound sources.

A slow attribute 340 may be an attribute of quiet and slow rhythm. The slow attribute 340 may relate to terms such as atmospheric, ambience, and the like and a quiet shape in time may appear mainly and a new acoustic event may occur rarely. Accordingly, an EQ value for emphasizing a slow rhythm and a relatively lower tone by emphasizing middle and low band and suppressing high band may be generated for the slow attribute 340.

The probability values of the four music attributes may be defined as real numbers from 0 to 1, so that a sum of the probability values of the four music attributes is 1.

A classification criterion with respect to the attributes of the music described above and a high classification accuracy are required for generating EQ value to be applied to the input music by analyzing the attributes of the input music. This may be achieved using the convolutional neural network (CNN) 122-1 based on deep learning.

The convolutional neural network is a type of deep learning and may be used in an object recognition field of an image and sound through convolution operation.

The convolutional neural network trained through machine learning may be used in various fields such as multimedia content classification or speech recognition. The operation of the neural network may be formed of a structure of repeating calculation units for obtaining a simple linear operation Y=W*X+b with respect to an input vector X to pass a nonlinear function over several layers.

For example, the training of neural network may be a process of optimizing weight vectors W and b so that the neural network outputs a value closest to a correct answer of learning data. In this case, if sufficient data and correct answer label may be used, supervised learning may be used and, if not, transfer learning or self-supervised learning may be used.

The probability values of the four music attributes may be output values of the convolutional neural network.

The analysis module 122 may immediately analyze the music attribute of the input music signal through the convolutional neural network 122-1 and generate an optimal EQ value that may be dynamically applied in accordance with the changing attribute analysis result. In addition, it is possible to minimize a time delay between the music attribute analysis of the processor through the convolutional neural network 122-1 and application of EQ values, and the operation may be performed on a terminal without a server such as a cloud or the like.

The analysis module 122-2 may calculate (122-2) the moderate index by analyzing the music attribute. The moderate index M may be an index for determining whether one distinct music attribute appears or a plurality of music attributes similarly appear.

If the plurality of attributes similarly appear, the band to be emphasized by the EQ value generated by the EQ processing module 123 is ambiguous and a sound with no distinct characteristics is output. In order to prevent this, a general-purpose music EQ value that is normally preferred may be applied if the moderate index M is high. The specific description of the general-purpose music EQ value will be described with reference to FIG. 4.

The moderate index M may be derived from a Gini coefficient G. In Mathematical Expression 1 to 3, general definition of the Gini coefficient G with respect to observation data $\{x_1, \ldots, x_n\}$ may be calculated as below.

$$G = \frac{\sum_{i=1}^{n} \sum_{j=1}^{n} |x_i - x_j|}{2n^2 \bar{x}} \quad \text{[Mathematical Expression 1]}$$

Here, n represents a total number of total music attributes and $\tilde{x}$ represents an average value of observation data. Since all of observation data $x_1, \ldots, x_n$ are positive real number and $\sum_{i=1}^{n} x_i = n\bar{x} = 1$ is satisfied, the Gini coefficient G may be simplified as below.

$$G = \frac{\sum_{i=1}^{n} \sum_{j=1}^{n} |x_i - x_j|}{2n} = \frac{\sum_{i=1}^{n} \sum_{j=1}^{i} |x_i - x_j|}{n} \quad \text{[Mathematical Expression 2]}$$

In contrast with the Gini coefficient, the higher moderate index M may refer to a state where data is uniformly distributed. The moderate index M with an adjusted scale of 0 to 1 may be defined as below.

$$M = 1 - \frac{\sum_{i=1}^{n} \sum_{j=1}^{i} |x_i - x_j|}{n-1} \quad \text{[Mathematical Expression 3]}$$

The EQ processing module 123 may generate (123-1) the EQ value suitable for the input music signal based on the probability value for each of the plurality of music attributes analyzed from the input music signal and the moderate index M and apply (123-2) the EQ value to the input music signal for equalizing, as described in the analysis module 122.

When the probability value of each attribute and the moderate index M are applied to the plurality of music attribute, an EQ value $G_{eq}$ of the moment generated by the EQ processing module 123 may be calculated as follows:

$$G_{eq} = M \cdot G_{moderate} + (1-M)G_{attribute} \quad \text{[Mathematical Expression 4]}$$

$$G_{attribute} = \sum_{i=1}^{n} p_i \cdot G_i \quad \text{[Mathematical Expression 5]}$$

In Mathematical Expressions 4 and 5, $G_{eq}$ represents the EQ value to be applied, M represents the moderate index, $G_{moderate}$ represents the general-purpose EQ value, $G_{attribute}$ represents a gain value obtained by reflecting a plurality of music attributes, $G_i$ represents an EQ value set for each attribute, and $p_i$ represents a probability value for each attribute. However, in order to prevent an excessively rapid change of the sound, values obtained by exponential moving averaging may be used for all of the probability values.

Referring to Mathematical Expression 4, as the value of the moderate index M is closer to 0, in other words, when there is at least one music attribute appearing distinctly among the plurality of music attributes, the EQ value generated by the EQ processing module 123 may have a value closer to $G_{attribute}$ which is a gain value obtained by reflecting the plurality of music attributes. That is, $G_{attribute}$ is a gain value obtained by multiplying the probability value of a music attribute i and an EQ value i set for a music attribute i.

On the other hand, as the value of the moderate index M is closer to 1, in other words, when the probability values of the plurality of music attributes uniformly appear, the EQ value generated by the EQ processing module 123 may have a value closer to $G_{moderate}$ which is the general-purpose EQ value.

For example, referring to [Table 1] below, the value of the moderate value M calculated with respect to a combination of some of the plurality of probability values are shown.

TABLE 1

| $p_1$ | $p_2$ | $p_3$ | $p_4$ | Moderate index M |
|---|---|---|---|---|
| 1.00 | 0.00 | 0.00 | 0.00 | 0.00 |
| 0.90 | 0.10 | 0.00 | 0.00 | 0.07 |
| 0.85 | 0.05 | 0.05 | 0.05 | 0.20 |
| 0.70 | 0.10 | 0.10 | 0.10 | 0.40 |
| 0.60 | 0.20 | 0.10 | 0.10 | 0.47 |
| 0.40 | 0.40 | 0.10 | 0.10 | 0.60 |
| 0.40 | 0.30 | 0.20 | 0.10 | 0.67 |
| 0.30 | 0.30 | 0.20 | 0.20 | 0.87 |
| 0.30 | 0.25 | 0.25 | 0.20 | 0.90 |
| 0.25 | 0.25 | 0.25 | 0.25 | 1.00 |

FIG. 3 is a diagram illustrating EQ gain set values for each attribute of a music signal according to an embodiment.

Referring to FIG. 3, gains which may be applied in accordance with frequencies of the input music signal are illustrated with respect to the plurality of music attributes (loud, soft, dynamic, and slow).

As described above with reference to FIG. 2, the EQ value for reinforcing a noisy tone in a high range rather than a low range may be generated for the loud attribute 310. For example, the EQ value for emphasizing softness of a tone by emphasizing a middle and low band by approximately 30% compared to a high band increased amount may be generated for the soft attribute 320. The EQ value for emphasizing a low tone and a middle and high band tone excluding an ultralow tone may be generated for the dynamic attribute 330. The EQ value for emphasizing a slow rhythm and a relatively lower tone by emphasizing the middle and low band and suppressing the high band may be generated for the slow attribute 340.

Figure 4:
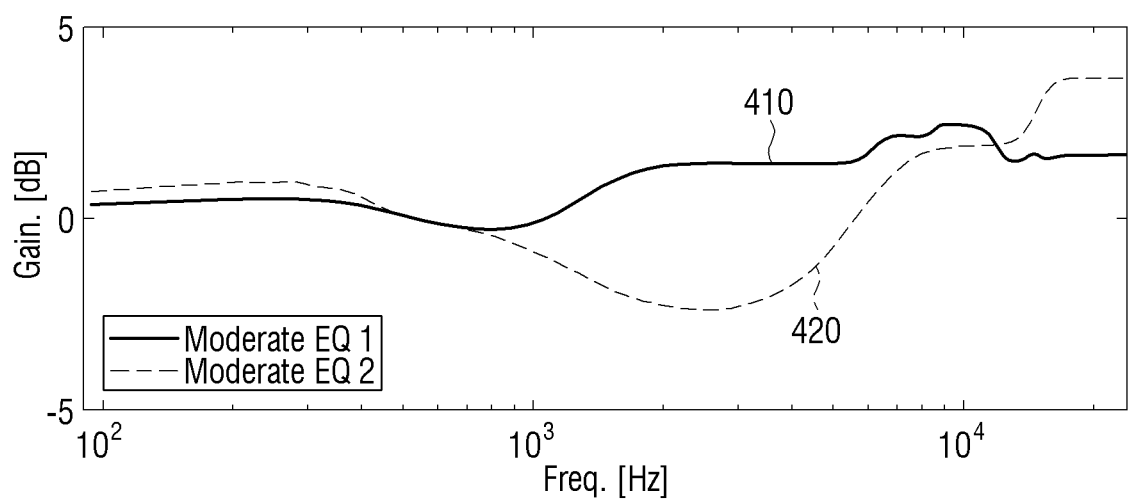
FIG. 4 is a diagram illustrating a general-purpose music EQ gain set value according to an embodiment.

FIG. 4 is a diagram illustrating a general-purpose music EQ gain set value according to an embodiment.

FIG. 4 illustrates an embodiment of general-purpose music EQ values 410 and 420 which may be used when the moderate index M is high. As described above, the general-purpose music EQ is normally preferred by the user when the moderate index M of the plurality of music attributes is high. The music EQ setting normally preferred by the user may be in a form emphasizing the low tone and high band.

Hereinafter, the EQ generation of the music signal of the EQ processing module 123 will be described in detail with reference to FIGS. 5 to 7.

Figure 5:
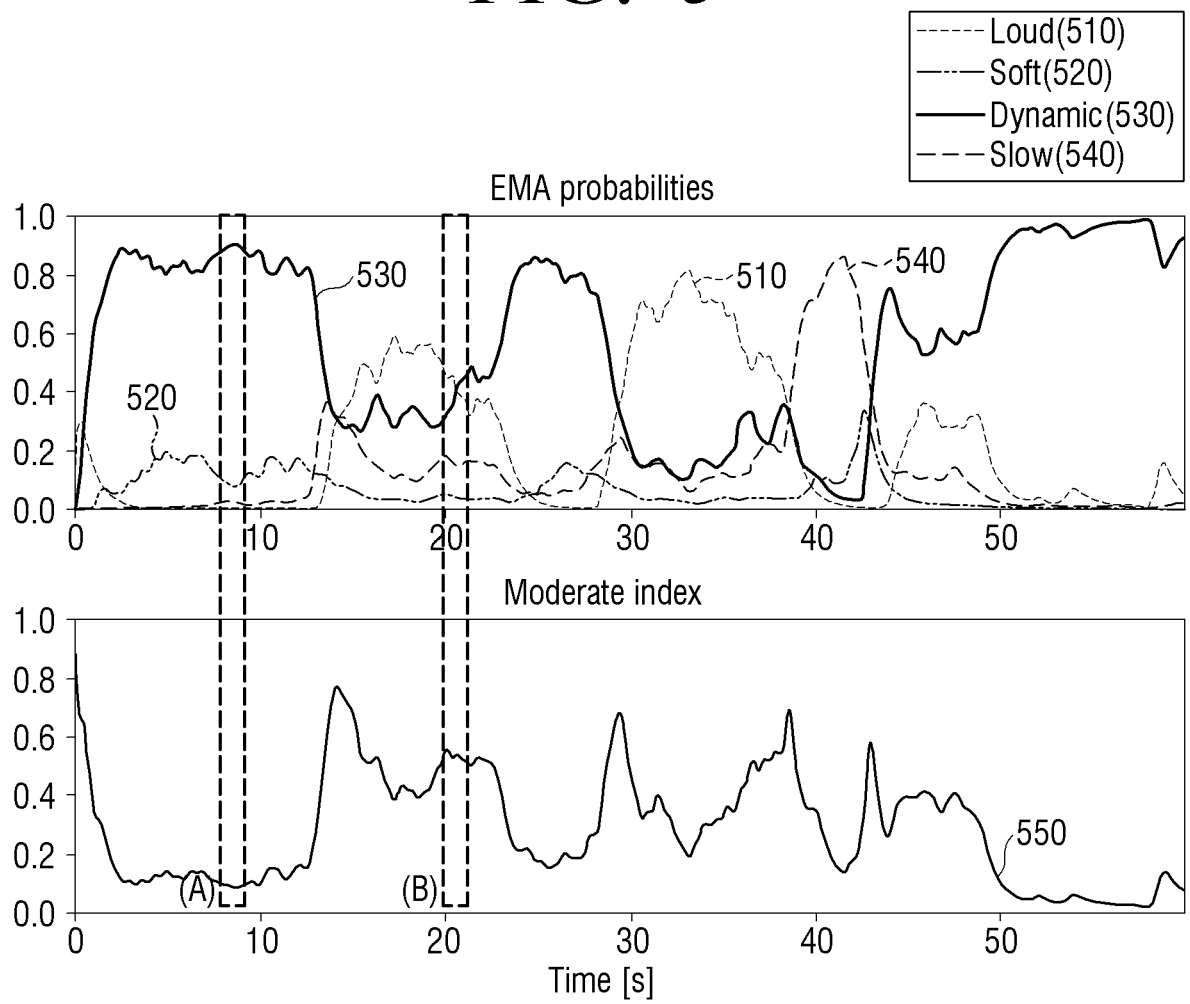
FIG. 5 is a diagram illustrating EQ generation of an input music signal according to an embodiment.
Figure 6:
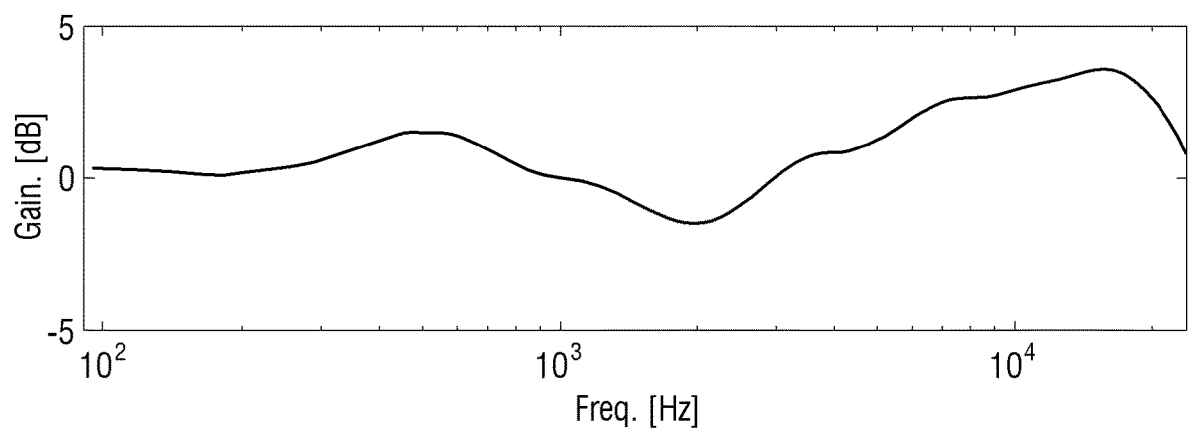
FIG. 6 is a diagram illustrating EQ values generated in a section (A) of FIG. 5.
Figure 7:
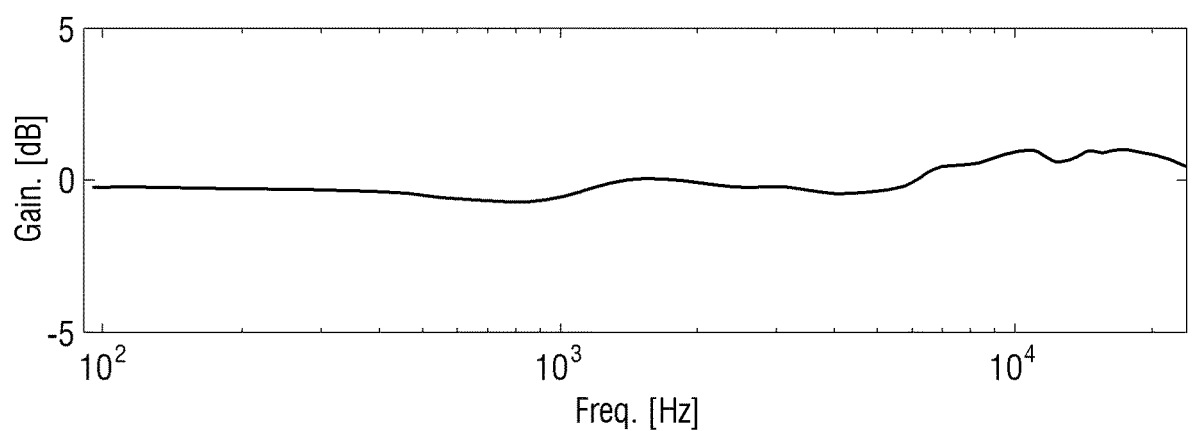
FIG. 7 is a diagram illustrating EQ values generated in a section (B) of FIG. 5.

FIGS. 5 to 7 are diagrams illustrating the EQ generation of the music signal according to an embodiment.

FIG. 5 illustrates a process in which the generated EQ value curve may be changed with respect to music having dynamically changing attribute.

FIG. 6 is a diagram illustrating an enlarged view of EQ values 550 generated in a section (A) of FIG. 5. A dynamic attribute 530 strongly appears in the section (A) (from the start point 0 to about 13 seconds), and accordingly, the generated EQ value 550 may be distinctly reflected by the dynamic attribute 530. Referring to FIG. 3, the EQ value 550 generated in this case may similarly appear as the EQ value for the dynamic attribute 330 of FIG. 3.

Meanwhile, FIG. 7 is a diagram illustrating an enlarged view of EQ values 550 generated in a section (B) of FIG. 5. The plurality of music attributes 510, 520, 530, and 540 appear similarly in the section (B) (from about 13 seconds to about 22 seconds), and accordingly, the moderate index M may increase and the generated EQ value 550 may be generated to be close to the music EQ normally preferred. Referring to FIG. 4, the EQ value 550 generated in this case may appear similarly to the general-purpose EQ value 410 of FIG. 4.

Figure 8:
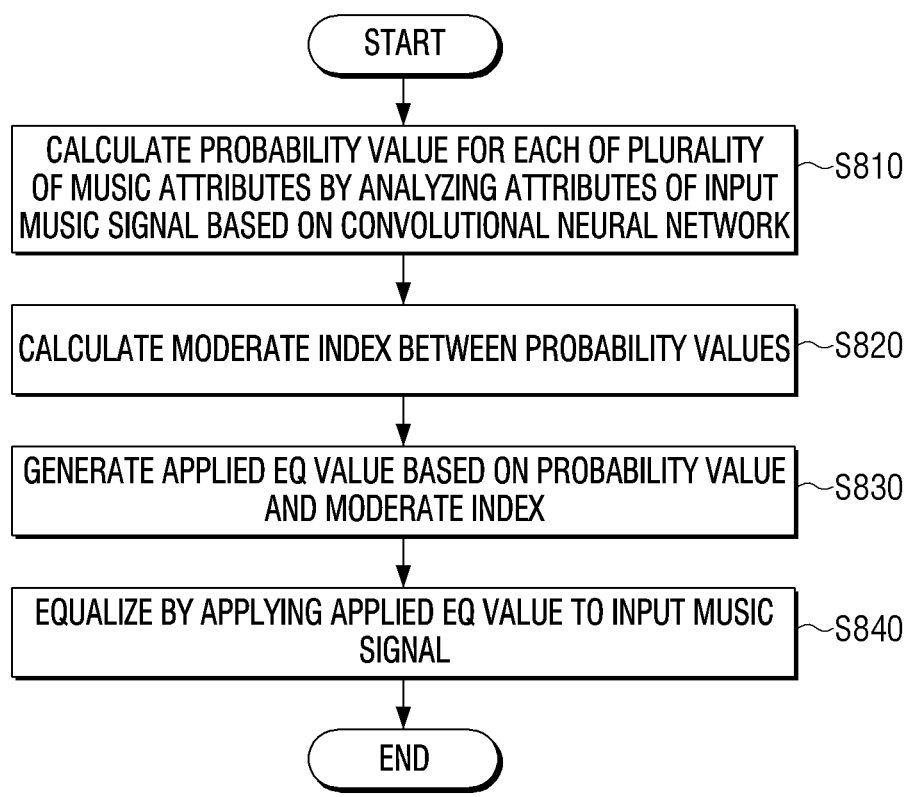
FIG. 8 is a flowchart illustrating an equalizing method according to an embodiment.

FIG. 8 is a flowchart illustrating an equalizing method according to an embodiment.

The probability value for each of the plurality of music attributes may be calculated by analyzing the attribute of the input music signal based on the convolutional neural network 122-1 (S810).

The moderate index M between the probability values may be calculated (S820).

The EQ value may be generated based on the probability value and the moderate index (S830).

The equalizing may be performed by applying the generated EQ value to the input music signal (S840).

Figure 9:
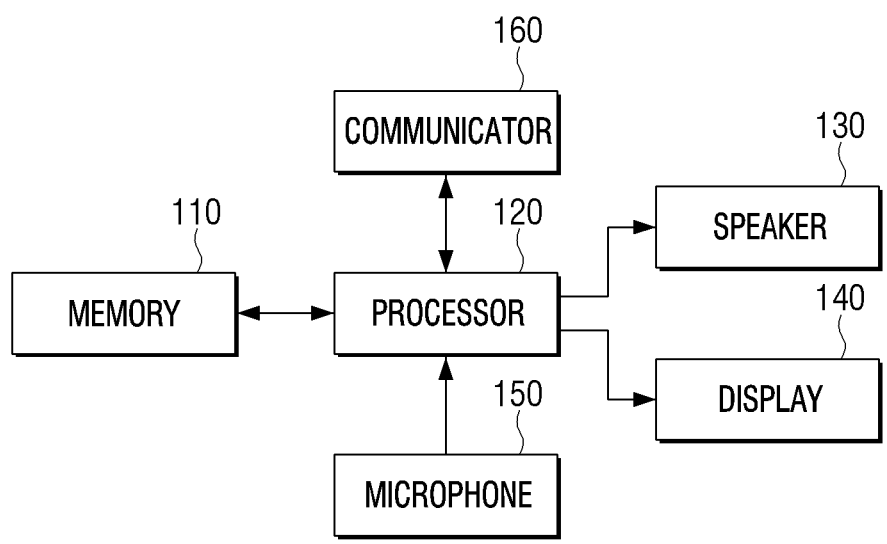
FIG. 9 is a block diagram illustrating components of an equalizer according to an embodiment.

FIG. 9 is a block diagram illustrating components of the equalizer 100 according to an embodiment.

Referring to FIG. 9, the equalizer 100 may include the memory 110, the processor 120, a speaker 130, the display 140, the microphone 150, and a communicator 160.

The memory 110 and the processor 120 have been described above with reference to FIG. 1, and thus any overlapping description will not be repeated.

The speaker 130 may output a music signal subjected to the equalizing.

The display 140 may be implemented as various types of display such as a liquid crystal display panel (LCD), a light emitting diode (LED), organic light emitting diodes (OLED), a liquid crystal on silicon (LCoS), a digital light processing (DLP), and the like. The display 140 may also include a driving circuit or a backlight unit which may be implemented in a form of a-si TFT, a low temperature poly silicon (LTPS) TFT, or an organic TFT (OTFT). The display 140 may further include a graphics processing unit (GPU).

The equalizing may be visually displayed via the display 140. For example, the display 140 may display data related to the equalizing being performed by the processor 120 in a form of a graphic equalizer.

The microphone 150 may receive an audio including various music signals. Here, the music signal may be an analog signal generated around the microphone. The music signal received via the microphone 150 may be input to the processor 120 to be equalized.

The communicator 160 may transmit and receive various signals by communicating with an external electronic device according to various types of communication methods. The communicator 160 may include a communication circuit including an antenna and the like.

The music signal received via the communicator 160 may be input to the processor 120 to be equalized. The communicator 160 may receive a music file from an external server. In this case, not only the music signal, but also information regarding metadata such as music genre, artist information, and the like of the music content may be received.

It is described that the speaker 130, the display 140, the microphone 150, and the communicator 160 are included, but in certain implementation, some elements may be excluded and other elements may be further added.

The embodiments of the disclosure have been shown and described, however, the embodiments of the disclosure are not limited to the aforementioned specific embodiments, and it is apparent that various modifications, substitutions, and improvements can be made by those having ordinary skill in the art in the technical field to which the disclosure belongs, without departing from the gist of the disclosure as claimed by the appended claims. Also, it should be understood that such modifications, substitutions, and improvements shall fall within the protection scope of the disclosure, and should not to be construed independently from the technical idea or prospect of the disclosure.

What is claimed is:

1. An equalizer comprising:
    a memory storing an EQ value set for a plurality of music attributes and storing a general-purpose EQ value; and
    a processor configured to:
        obtain an input music signal;
        obtain a plurality of probability values for the plurality of music attributes by identifying attributes of the input music signal based on a convolutional neural network;
        obtain a moderate index between the plurality of probability values, the moderate index being based on a summation of differences between the plurality of probability values and a total number of the plurality of music attributes;
        obtain an EQ value based on the plurality of probability values and the moderate index; and
        perform a function corresponding to equalizing by applying the obtained EQ value to the input music signal,
    wherein the processor is further configured to, based on the input music signal being obtained, perform a function corresponding to down-sampling on the input music signal to reduce a data size of the input music signal to a predetermined level for identifying the input music signal.

2. The equalizer according to claim 1, wherein the processor is further configured to convert the input music signal with the reduced data size into a two-dimensional time-frequency signal and provide the two-dimensional time-frequency signal to the convolutional neural network.

3. The equalizer according to claim 1, wherein the processor is further configured to obtain the moderate index using an expression $$M = 1 - \frac{\sum_{i=1}^{n} \sum_{j=1}^{i} |p_i - p_j|}{n-1},$$

where M represents the moderate index, $p_i$ represents a probability value for a music attribute i among the plurality of music attributes, and n represents the total number of the plurality of music attributes.

4. The equalizer according to claim 1, wherein the processor is further configured to obtain the EQ value using expressions $G_{eq} = M \cdot G_{moderate} + (1-M) G_{attribute}$ and $G_{attribute} = \sum_{i=1}^{n} p_i \cdot G_i$, where $G_{eq}$ represents the obtained EQ value, M represents the moderate index, $G_{moderate}$ represents the general-purpose EQ value, $G_i$ represents an EQ value i set for a music attribute i, $p_i$ represents a probability value for the music attribute i among the plurality of music attributes, and $G_{attribute}$ represents a gain value obtained based on the probability value for the music attribute i and the EQ value i set for the music attribute i.

5. The equalizer according to claim 1, wherein one of the plurality of music attributes comprises at least one from among a loud attribute, a soft attribute related to a tone, a dynamic attribute and a slow attribute related to complexity of a rhythm.

6. An equalizing method of an equalizer, the method comprising:
    obtaining an input music signal;
    based on the input music signal being obtained, perform a function corresponding to down-sampling on the input music signal to reduce a data size of the input music signal to a predetermined level for identifying the input music signal;
    obtaining a plurality of probability values for a plurality of music attributes by identifying attributes of the input music signal based on a convolutional neural network;
    obtaining a moderate index between the plurality of probability values, the moderate index being based on a summation of differences between the plurality of probability values and a total number of the plurality of music attributes;
    obtaining an EQ value based on the plurality of probability values and the moderate index; and
    performing a function corresponding to equalizing by applying the obtained EQ value to the input music signal.

7. The equalizing method according to claim 6, further comprising:
    converting the input music signal with the reduced data size into a two-dimensional time-frequency signal.

8. The equalizing method according to claim 6, wherein the obtaining the moderate index between the plurality of probability values comprises:
    obtaining the moderate index using an expression $$M = 1 - \frac{\sum_{i=1}^{n} \sum_{j=1}^{i} |p_i - p_j|}{n-1},$$

where M represents the moderate index, $p_i$ represents a probability value for a music attribute i among the plurality of music attributes, and n represents the total number of the plurality of music attributes.

9. The equalizing method according to claim 6, wherein the obtaining the EQ value based on the plurality of probability values and the moderate index comprises:
obtaining the EQ value using expressions $G_{eq}=M \cdot G_{moderate}+(1-M)G_{attribute}$ and $G_{attribute}=\Sigma_{i=1}^{n} p_i \cdot G_i$, where $G_{eq}$ represents the obtained EQ value, M represents the moderate index, $G_{moderate}$ represents a general-purpose EQ value, $G_i$ represents an EQ value i set for a music attribute i, $p_i$ represents a probability value for the music attribute i among the plurality of music attributes, and $G_{attribute}$ represents a gain value obtained based on the probability value for the music attribute i and the EQ value i set for the music attribute i.

10. The equalizing method according to claim 6, wherein one of the plurality of music attributes comprises at least one from among a loud attribute, a soft attribute related to a tone, a dynamic attribute and a slow attribute related to complexity of a rhythm.

11. A non-transitory computer readable recording medium storing a program for performing equalizing, the program when executed by a processor, causes the processor to:

based on an input music signal being obtained, perform a function corresponding to down-sampling on the input music signal to reduce a data size of the input music signal to a predetermined level for identifying the input music signal;

convert the input music signal with the reduced data size into a two-dimensional time-frequency signal and provide the two-dimensional time-frequency signal as an input of a convolutional neural network;

obtain a plurality of probability values for a plurality of music attributes by identifying attributes of the input music signal based on the convolutional neural network;

obtain a moderate index between the plurality of probability values, the moderate index being based on a summation of differences between the plurality of probability values and a total number of the plurality of music attributes;

obtain an EQ value based on the plurality of probability values and the moderate index; and perform a function corresponding to equalizing by applying the obtained EQ value to the input music signal.

* * * * *